(12) United States Patent
Morikawa et al.

(10) Patent No.: US 8,098,003 B2
(45) Date of Patent: Jan. 17, 2012

(54) LIGHT EMITTING MODULE AND ILLUMINATION DEVICE

(75) Inventors: Kazuto Morikawa, Yokosuka (JP); Masahiro Izumi, Yokosuka (JP); Kiyoshi Nishimura, Yokosuka (JP); Tomohiro Sanpei, Yokosuka (JP); Erika Takenaka, Yokosuka (JP); Shuhei Matsuda, Yokosuka (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 50 days.

(21) Appl. No.: 12/790,395

(22) Filed: May 28, 2010

(65) Prior Publication Data

US 2010/0301731 A1    Dec. 2, 2010

(30) Foreign Application Priority Data

Jun. 1, 2009 (JP) ................. 2009-132319
Apr. 30, 2010 (JP) ................. 2010-105665

(51) Int. Cl.
*H01J 5/16* (2006.01)
(52) U.S. Cl. .................. 313/113; 313/506
(58) Field of Classification Search ........... 313/113, 313/114, 498, 506
See application file for complete search history.

(56) References Cited

U.S. PATENT DOCUMENTS

| | | | |
|---|---|---|---|
| 4,729,076 | A | 3/1988 | Masami et al. |
| 5,863,109 | A | 1/1999 | Hsieh |
| 5,954,423 | A | 9/1999 | Logan et al. |
| 6,034,712 | A | 3/2000 | Iwasaki |
| 6,310,364 | B1 | 10/2001 | Uemura |
| 6,415,531 | B1 | 7/2002 | Ohtsuki et al. |
| 6,936,855 | B1 | 8/2005 | Harrah |
| 7,427,145 | B2 | 9/2008 | Jang et al. |
| 7,728,343 | B2 | 6/2010 | Fujino et al. |
| 2001/0030866 | A1 | 10/2001 | Hochstein |
| 2003/0137828 | A1 | 7/2003 | Ter-Hovhannisian |
| 2003/0189830 | A1 | 10/2003 | Sugimoto et al. |
| 2003/0201451 | A1 | 10/2003 | Suehiro et al. |
| 2004/0065894 | A1 | 4/2004 | Hashimoto et al. |
| 2005/0030752 | A1 | 2/2005 | Imai |
| 2005/0135105 | A1 | 6/2005 | Teixeire et al. |
| 2006/0157724 | A1 | 7/2006 | Fujita |
| 2007/0252166 | A1 | 11/2007 | Chang et al. |
| 2008/0019133 | A1 | 1/2008 | Kim et al. |
| 2008/0055901 | A1 | 3/2008 | Sanpei et al. |
| 2008/0128739 | A1 | 6/2008 | Sanpei et al. |

(Continued)

FOREIGN PATENT DOCUMENTS

CN    2665934    12/2004

(Continued)

OTHER PUBLICATIONS

English Abstract of JP-2002-94122 published Mar. 29, 2002.

(Continued)

*Primary Examiner* — Vip Patel
(74) *Attorney, Agent, or Firm* — DLA Piper LLP US

(57) ABSTRACT

According to one embodiment, a light-emitting module includes a module substrate, a reflective layer, conductive layers, a light-emitting element, and a sealing member. A reflective layer is provided on a surface of an insulating layer of the module substrate, and the conductive layers are provided in the vicinity of the reflective layer. Further, the light-emitting element is provided on the reflective layer. Moreover, the translucent sealing member has translucency and bury the reflective layer, the conductive layers, and the light-emitting element. The ratio of the area occupied by the reflective layer and the conductive layers to the sealed region sealed by the sealing member is equal to or greater than 80%.

10 Claims, 7 Drawing Sheets

U.S. PATENT DOCUMENTS

2010/0188852 A1  7/2010  Sanpei et al.

FOREIGN PATENT DOCUMENTS

| CN | 1880836 | 12/2006 |
|---|---|---|
| JP | 4-67360 | 3/1992 |
| JP | 7288341 | 10/1995 |
| JP | 8-264840 | 10/1996 |
| JP | 2002-94122 | 3/2002 |
| JP | 3329573 | 9/2002 |
| JP | 2003-69083 | 3/2003 |
| JP | 2003-152225 | 5/2003 |
| JP | 2004-265986 | 9/2004 |
| JP | 2005-235779 | 2/2005 |
| JP | 2005-210042 | 8/2005 |
| JP | 2006-41380 | 2/2006 |
| JP | 2006-93399 | 4/2006 |
| JP | 2006-140207 | 6/2006 |
| JP | 2006-295085 | 10/2006 |
| JP | 2007-116117 | 5/2007 |
| JP | 2008-277561 | 11/2008 |
| WO | WO 03/030274 | 4/2003 |
| WO | WO 2007/086229 | 8/2007 |

OTHER PUBLICATIONS

English Language machine translation of JP 2002-94122 published Mar. 29, 2002.
European Search Report Issued in counterpart European Application No. 07 25 4612, mailed Apr. 3, 2008.
U.S. Appl. No. 11/947,075 as of Oct. 19, 2010.
U.S. Appl. No. 12/751,261 as of Oct. 19, 2010.
Office Action issued in Chinese Appl 200710194723.X on Jun. 5, 2009.
English Translation of Office Action issued in Chinese Appl 200710194723.X on Jun. 5, 2009.
Office Action issued in Japanese Appl. 2007-250227 on Jun. 8, 2010.
English Translation of Office Action issued in Japanese Appl. 2007-250227 on Jun. 8, 2010.
English Abstract of JP 2003-152225 published May 25, 2003.
English Language Translation of JP 2003-152225 published May 25, 2003.
English Abstract of JP 2003-069083 published Mar. 7, 2003.
English Translation of JP 2003-069083 published Mar. 7, 2003.
English Abstract of JP 2004-265986 published Sep. 24, 2004.
English Translation of JP 2004-265986 published Sep. 24, 2004.
English Abstract of JP 2006-295085 published Oct. 26, 2006.
English Translation of JP 2006-295085 published Oct. 26, 2006.
English Abstract of JP 2005-210042 published Aug. 4, 2005.
English Translation of JP 2005-210042 published Aug. 4, 2005.
English Language Abstract of JP 2008-277561, published Nov. 13, 2008.
Machine English Language Translation of JP 2008-277561, published Nov. 13, 2008.
U.S. Appl. No. 11/947,075 as of Jul. 19, 2011.
U.S. Appl. No. 11/844,037 from May 3, 2011 to Jul. 19, 2011.
U.S. Appl. No. 13/078,601 as of Jul. 19, 2011.
English Abstract of JP Publication 728834 published Oct. 31, 1995 (corresponding to JP 3329573).
English machine translation of JP 3329573 published Sep. 30, 2002.
Office Action issued in JP Appl 2007-184808 on May 25, 2010.
English Translation of Office Action issued in JP Appl 2007-184808 on May 25, 2010.
Office Action issued in CN Appl 2007-101455584.1 on Sep. 5, 2008.
Partial English Translation of Office Action issued in CN Appl 2007-101455584.1 on Sep. 5, 2008.
Office Action issued in CN 2007-101455584.1 on Jan. 23, 2009.
Partial English Translation of Office Action issued in CN 2007-101455584.1 on Jan. 23, 2009.
Office Action issued in JP Appl 2007-184808 on Jul. 20, 2010.
English Language Translation of Office Action issued in JP Appl 2007-184808 on Jul. 20, 2010.
English Abstract of JP 2006-41380 published Feb. 9, 2006.
Machine Language Translation of JP 2006-41380 published Feb. 9, 2006.
English Abstract of JP 8-264840 published Oct. 11, 1996.
Machine Language Translation of JP 8-264840 published Oct. 11, 1996.
English Abstract of JP 2005-235779 published Sep. 2, 2005.
Machine Language Translation of JP 2005-235779 published Sep. 2, 2005.
English Abstract of WO 2003/030274 published Apr. 10, 2003.
English Abstract of JP 2006-140207 published Jun. 1, 2006.
Machine Translation of JP 2006-140207 published Jun. 1, 2006.
English Abstract of JP 2007-116117 published May 10, 2007.
Machine Translation of JP 2007-116117 published May 10, 2007.
English Abstract of CN Appl 2665934 published Dec. 22, 2004.
English Translation of CN 1880836 published Dec. 20, 2006.
English Abstract of JP 4-67360 published Mar. 3, 1992.
Office Action issued in Japanese Appl 2007-184808 on Sep. 7, 2010.
English Translation of Office Action in Japanese Appl 2007-184808 on Sep. 7, 2010.
English Language Abstract of JP 2006-93399 published Apr. 6, 2006.
English Translation of JP 2006-93399 published Apr. 6, 2006.
English Abstract of JP 7288341 published Oct. 31, 1995.
Image File Wrapper in U.S. Appl. No. 12/751,261 as of Oct. 20, 2010 to May 2, 2011.
Image File Wrapper in U.S. Appl. No. 11/844,037 as of May 2, 2011.

LIGHT EMITTING MODULE AND ILLUMINATION DEVICE

CROSS-REFERENCE TO RELATED APPLICATIONS

This application is based upon and claims the benefit of priority from Japanese Patent Applications No. 2009-132319, filed Jun. 1, 2009; and No. 2010-105665, filed Apr. 30, 2010; the entire contents of both of which are incorporated herein by reference.

FIELD

Embodiments described herein relate generally to a light-emitting module comprising a plurality of light-emitting elements, such as light-emitting diodes (LEDs) arranged therein, and an illumination device incorporating the light-emitting module.

BACKGROUND

Generally, light-emitting modules using LEDs are manufactured by arranging a plurality of LEDs on a surface of a resin substrate in a proper alignment, electrically connecting adjacent LEDs via a bonding wire, and sealing the LEDs on the surface of the substrate using a translucent silicon resin. In order to effectively reflect light of the LEDs, the substrate is formed of epoxy resin into which titanium oxide powders are mixed, for example, and is formed so as to have a white surface.

When the LEDs are blue light-emitting diodes, however, since titanium oxide is easily resolved by blue light, the surface of the substrate deteriorates with time and becomes rough. When the surface of the substrate becomes rough, reflectance of the surface substrate deteriorates, and luminous efficiency of the light-emitting module deteriorates with time.

In order to increase reflectivity of the substrate surface, an approach of providing a metal reflective layer on a surface of a substrate including LEDs mounted thereon has been proposed. In this case, a plurality of silver reflective layers having relatively high reflectivity are provided on the surface of the substrate of each LED.

When blue light of the LEDs is made incident on the substrate surface exposed between the reflective layers, however, unbonded molecules of the epoxy resin are photodegraded and gasified. The gasified organic components react with the silver reflective layers via a gas-permeable silicon resin sealing the LEDs. Thereby, the top surface of the reflective layer is tarnished to a darkish color. This reaction continues until release of the gas ends.

That is, even by providing metal reflective layers on a surface of the substrate, when the portion of the substrate surface that is exposed without being provided with a reflective layer is large, the reflective layer itself may be tarnished with time, and the reflectivity may deteriorate.

DETAILED DESCRIPTION

Figure 1:
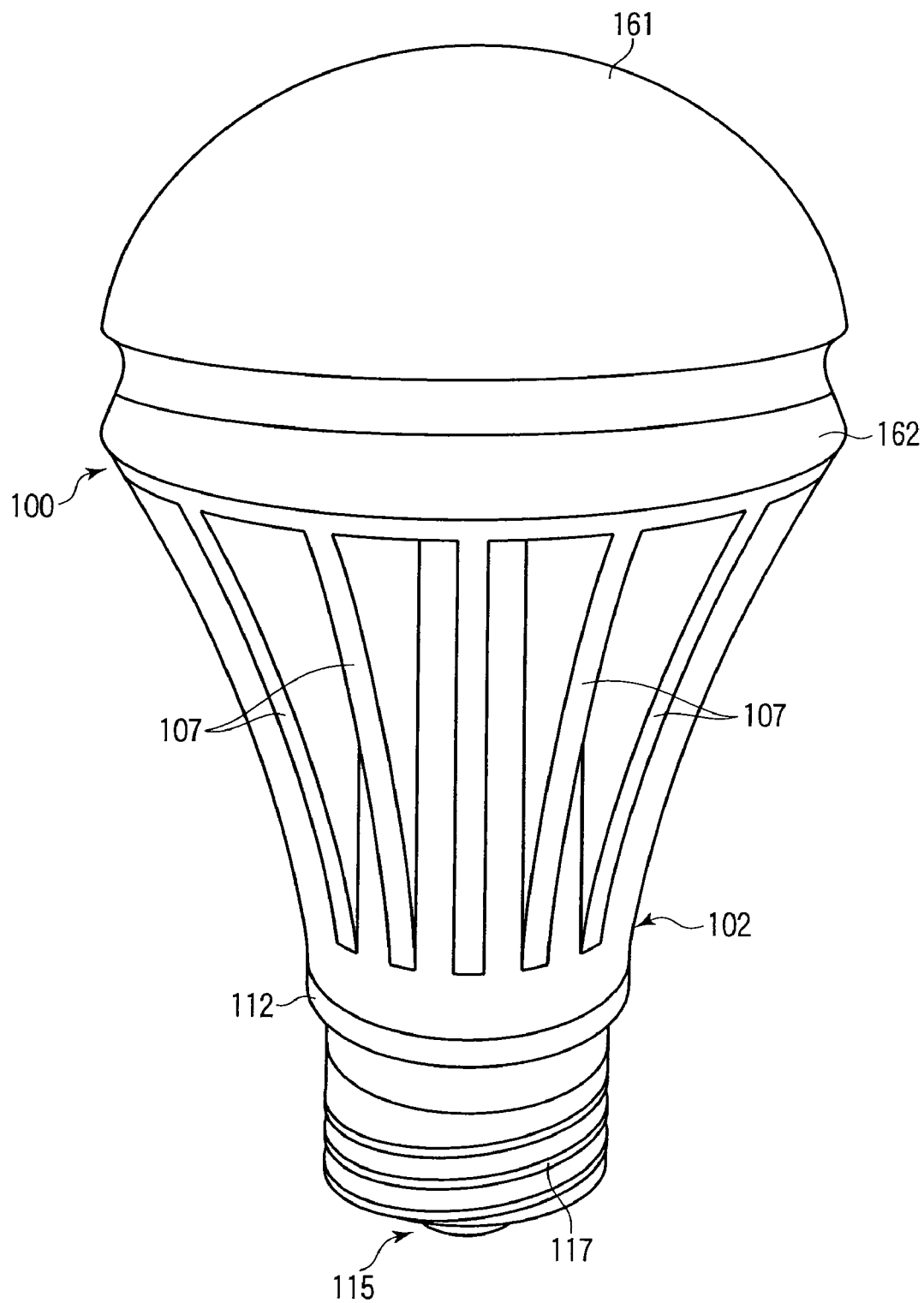
FIG. 1 is an outer view of a LED lamp according to an embodiment of the present invention.

Various embodiments will be described hereinafter with reference to the accompanying drawings. In general, according to one embodiment of the invention, a light-emitting module 1 comprises a module substrate 5, a reflective layer 11, conductive layers 12, 13, light-emitting elements 21, and a sealing member 28. The reflective layer 11 is provided on the surface of an insulating layer of the module substrate 5, and the conductive layers 12, 13 are provided in the vicinity of the reflective layer 11. The light-emitting elements 21 are provided on the reflective layer 11. The reflective layer 11, the conductive layers 12, 13, and the light-emitting elements 21 are embedded with the translucent sealing member 28. The ratio of the area occupied by the reflective layer 11 and the conductive layers 12, 13 to the sealed region sealed by the sealing member 28 is equal to or greater than 80%.

Figure 2:
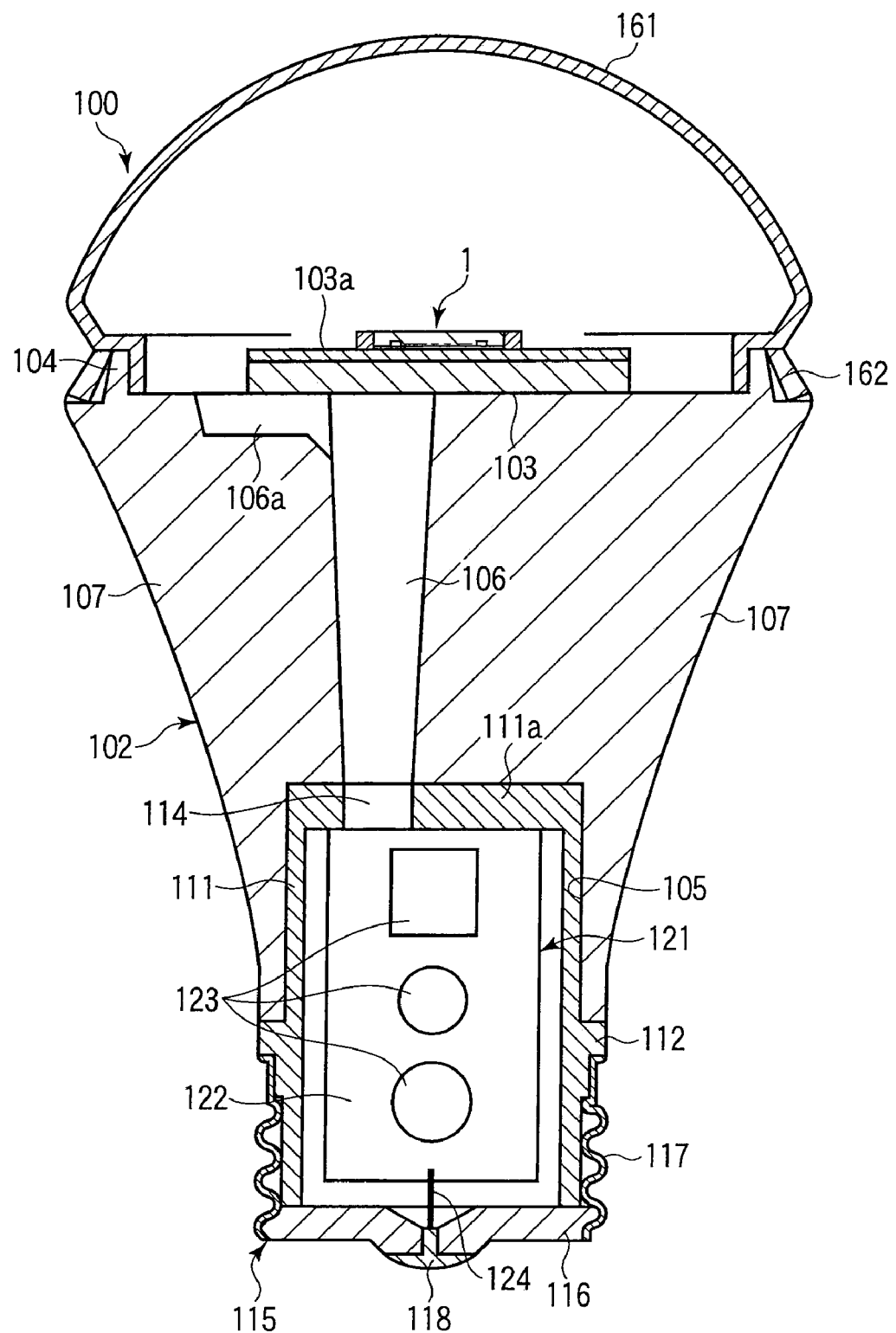
FIG. 2 is a cross-sectional view of the LED lamp shown in FIG. 1.

FIG. 1 shows an outer view of a LED lamp 100 as an example of an illumination device incorporating a light-emitting module according to an embodiment of the present invention. FIG. 2 is a cross-sectional view of the LED lamp 100 of FIG. 1 cut along the axial line.

The LED lamp 100 comprises a main body 102, an insulating body 111, a base 115, a lighting device 121, a light-emitting module 1, and an illumination cover 161. The LED lamp 100 is attached such that the illumination cover 161 faces downward by hinging the base 115 to a socket, not shown, attached to a ceiling, for example. That is, FIGS. 1 and 2 show the LED lamp 100 in an upside-down state from the above-described attached state.

The main body 102 is formed of aluminum, which has a relatively high heat conductivity. As shown in FIG. 2, a module fixing mount 103 configured to mount the light-emitting module 1 is provided at the upper end of the main body 102 in the drawing. Further, a circular cover attaching convex portion 104 is integrally provided around the module fixing mount 103 so as to protrude from the upper end of the main body.

Further, a concave portion 105 is provided at the lower end side of the main body 102 in the drawing, so as to be depressed upward. Further, a wire through hole 106 is formed inside the main body 102 so as to extend in its axial direction. The upper end of the wire through hole 106 is open to the upper end surface of the main body 102, and the lower end of the wire through hole 106 is open to the bottom surface of the concave portion 105. Further, a groove portion 106a is provided along the back surface of the module fixing mount 103 in continuity with the upper end of the wire through hole 106, so as to be bendable in the lateral direction.

Further, the main body 102 integrally includes a plurality of heat-radiating fins 107 along its outer circumference. The heat-radiating fins 107 are provided in a curved shape so as to extend outside toward the upper end of the main body 102, as shown in FIG. 1. The heat-radiating fins 107 are provided so as to radiate heat generated by the light-emitting module 1 to the outside of the LED lamp 100.

The insulating member 111 is formed in a cylinder shape including a bottom, as shown in FIG. 2 in cross section. Further, the insulating member 111 integrally includes a circular insulating convex portion 112 provided so as to protrude from its outer circumferential surface at an intermediate portion in its height direction. Further, the insulating member 111 is contained and arranged in the convex portion 105 so as to make a bottom wall 111a contact the bottom surface of the concave portion 105 and engage the insulating convex portion 112 with an edge of the opening of the concave portion 105. That is, the external surface of the insulating member 111 closely contacts the inner surface of the concave portion 105.

The portion lower than the insulating convex portion 112 of the insulating member 111 in the drawing protrudes downward from the lower end of the main body 102 in the drawing. In other words, only the portion upper than the insulating convex portion 112 of the insulating member 111 is inserted into the concave portion 105 of the main body 102. Further, a through hole 114 is provided in the bottom wall 111a of the insulating member 111 so as to make the lower end of the wire passing hole 6 pass through the inside of the insulating member 111.

The base 115 has a configuration in which a base body 117 and an eyelet terminal 118 are attached to approximately disc-shaped base 116, formed of an insulating material, as shown in FIG. 2. The base 115 of the present embodiment is an E26 type base. The base 115 is attached over the above-described lower portion such that the base 116 fills in the opening of the insulating member 111. The base body 117 includes a helical groove that is threadedly engaged to a socket on the power side, not shown.

The lighting device 121 is contained and arranged in the insulating member 111, as shown in FIG. 2. The lighting device 121 is formed on a circuit substrate 122 so as to mount circuit components 123, such as a transformer, a capacitor, and a transistor. The lighting device 121 is electrically connected to the base 115. A connecting member 124 therefor is exemplified in FIG. 2. The connecting member 124 electrically connects the eyelet terminal 118 and the circuit substrate 122.

Further, the lighting device 121 is electrically connected to the light-emitting module 1, which will be described below, via an insulating coating wire, not shown, that passes through the wire passing hole 6 (groove portion 106a). Further, the lighting device 121 feeds a direct current to the light-emitting module 1 via the base 115.

The illumination cover 161 is formed in an approximately hemispherical shape, as shown in FIG. 1. The illumination cover 161 is formed of a translucent synthetic resin. As shown in FIG. 2, the illumination cover 161 is attached to the cover attachment convex portion 104, which protrudes from an upper end of the main body 102, so as to fit the cover attachment convex portion 104. That is, light emitted from the light-emitting module 1 is provided for use as illumination light via the illumination cover 161.

The cover attachment convex portion 104 on the side of the main body 102 includes an L-shaped attachment groove, not shown, in a plurality of portions along the peripheral direction. On the other hand, a plurality of engaging convex portions, not shown, are provided in positions corresponding to a plurality of attachment grooves of the cover attachment convex portion 104. That is, the illumination cover 161 is attached to the main body 102 by engaging the engaging convex portions with the respective attachment grooves of the cover attachment convex portion 104. As shown in FIGS. 1 and 2, a blindfold ring 162, designed to hide the attachment grooves and the engaging convex portions, is provided on an edge portion of the illumination cover 161.

Figure 3:
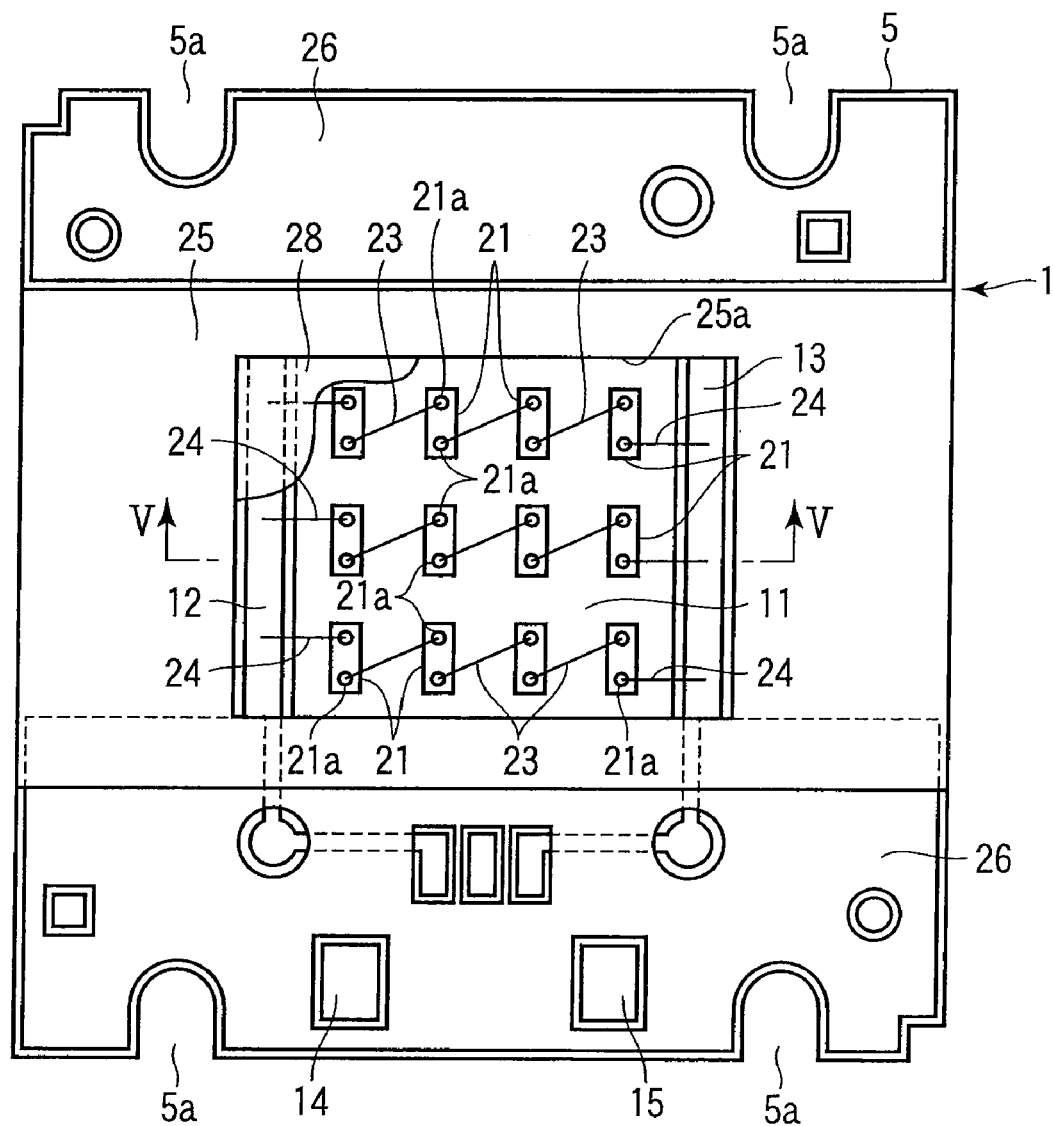
FIG. 3 is a plan view illustrating a light-emitting module incorporated in the LED lamp of FIG. 1, according to the first embodiment.
Figure 4:
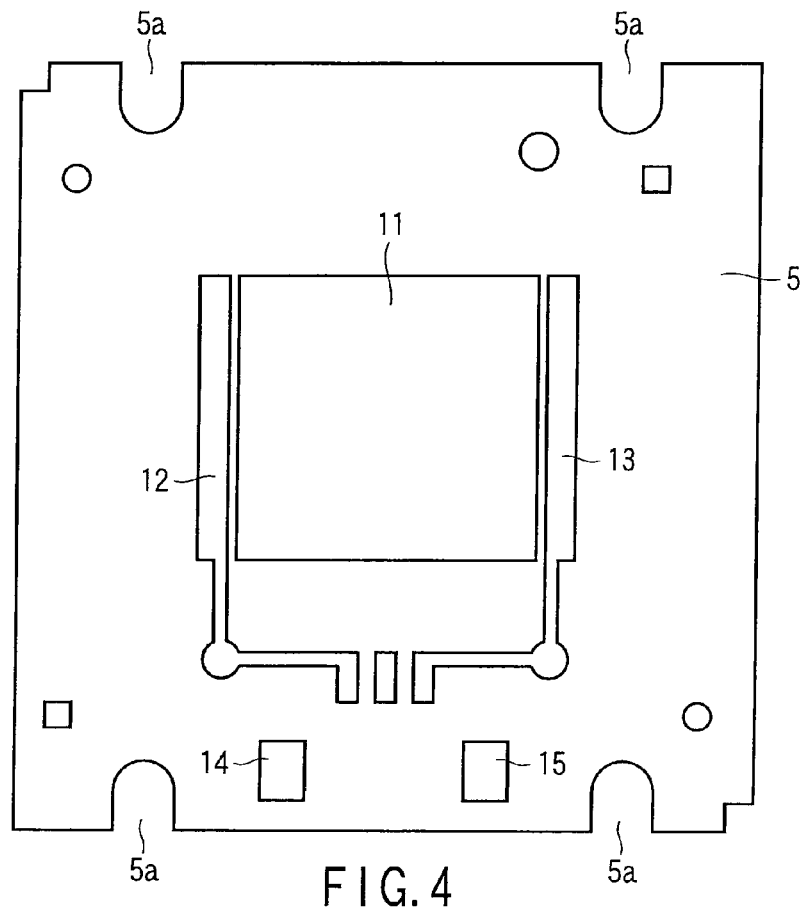
FIG. 4 is a plan view illustrating a module substrate of the light-emitting module of FIG. 3.
Figure 5:
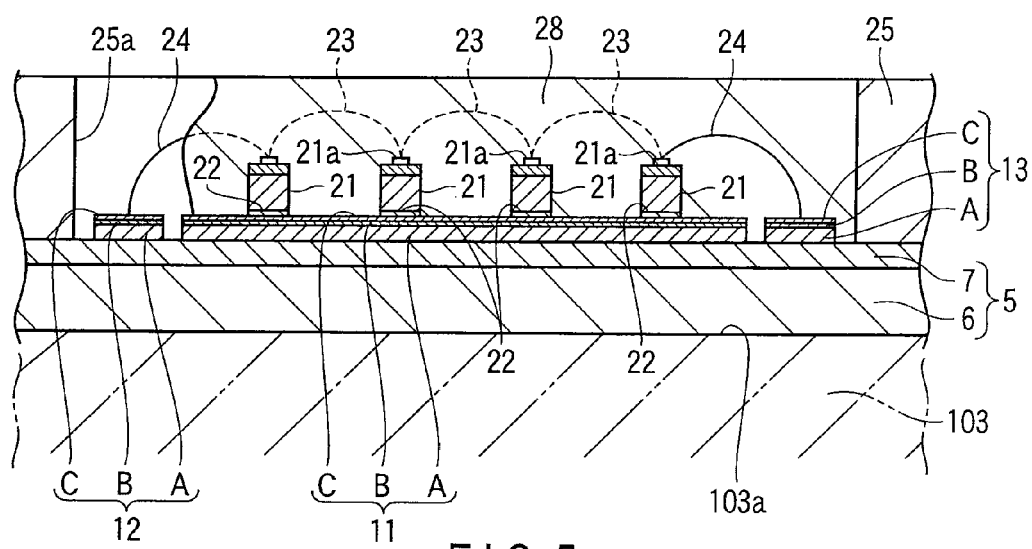
FIG. 5 is a partially exploded cross-sectional view in which main portions of the module substrate is cut along V-V of FIG. 3.

Hereinafter, the light-emitting module 1 of the first embodiment of the present invention will be described in detail with reference to FIGS. 3-5. FIG. 3 shows a plan view of the light-emitting module 1, viewed from the side (hereinafter referred to as surface side) from which light is taken, FIG. 4 shows a plan view of module substrate 5 of the light-emitting module 1, and FIG. 5 illustrates a partially exploded cross-sectional view of the main portions of the light-emitting module 1, cut along V-V of FIG. 3. The light-emitting module 1 has a chip-on-board (COB) type structure.

The light-emitting module 1 of the present embodiment comprises a module substrate 5 (FIG. 4) including a metal reflective layer 11, a conductive layer 12 on the positive electrode side, and a conductive layer 13 on the negative electrode side formed on the surface, a plurality of (12 in the present embodiment) light-emitting devices 21 arranged on the surface of the reflective layer 11 in proper alignment, a bonding wire 23 designed to serially connect the light-emitting devices 21 per line, an end bonding wire 24 designed to feed each line of the light-emitting devices 21, a frame member 25 surrounding a sealed region, and a sealing member 28 filled in a sealing hole 25a of the frame member 25.

The module substrate 5 is adhesively formed in an approximately rectangular shape, as shown in FIG. 4, for example. The module substrate 5 should preferably have a metal base substrate, for example, to enhance heat dissipation of the light-emitting devices 21. The module substrate 5 of the present embodiment has a structure in which an insulating layer 7 is stacked on the surface of a metal base plate 6, such that the insulating layer 7 is thinner than the base plate 6, as shown in FIG. 5.

The base plate 6 is formed of aluminum, for example. The insulating layer 7 is formed of a synthetic resin that is an electrically insulating organic material, such as epoxy resin, and a filler is mixed thereto at the ratio of 50% by mass, for example. The insulating layer includes resolution components that are photodegraded and gasified when light of the LEDs is made incident thereon.

In the present embodiment, the thickness of the insulating layer 7 is set to 50-200 μm, such as 120 μm, so as to suppress gasification caused by photolysis, which will be described later. When the thickness of the insulating layer 7 is equal to or less than 100 μm, such as 80 μm, the absolute amount of resolution components that are gasified can be decreased, which is suitable for preventing the tarnish problem of the reflective layer 11, which will be described later. The entire ray reflectivity of the insulating layer 7 is equal to or below 50%, such as 35.9%. The insulating layer 7 forms a mount surface of the module substrate 5.

The module substrate 5 is adhesively fixed to the surface of the module fixing mount 103 by being adhered to the surface 103a thereof. For that purpose, the module substrate 5 includes 4 notches 5a for attachment to the module fixing mount 103. That is, the module substrate 5 can be adhesively adhered to the main body 102 by engaging four screws, not shown, with screw holes, not shown, of the module fixing mount 103 via the four notches 5a.

The module fixing mount 103 is formed of metal, and is adhesively fixed to the upper surface of the main body 102. Accordingly, when the light-emitting devices 21 of the light-emitting module 1 are lit and the light-emitting module 1 generates heat, the heat is transmitted to the main body 102 via the module fixing mount 103.

The reflective layer 11, and the conductive layers 12, 13 are patterned on the top surface of the insulating layer 7 of the module substrate 5. As shown in FIG. 4, the reflective layer 11 is provided in a rectangular shape so as to occupy the central portion of the insulating layer 7, and the conductive layers 12, 13 are provided on either side in the longitudinal direction of the reflective layer 11, so as to interpose the reflective layer 11, for example, in the vicinity of the reflective layer 11. In other words, an elongated gap is formed between the reflective layer 11 and the conductive layers 12, 13 provided on both sides thereof, so as to expose the top surface of the insulating layer 7.

Thus, the conductive layers 12, 13 are provided on both sides of the reflective layer 11, when the reflective layer 11 is a single layer. Further, when there are more than one reflective layers 11, the conductive layers 12, 13 are provided on both sides thereof, so as to interpose the group of reflective layers. These reflective layers 11 and the conductive layers 12, 13 should preferably have a metal surface area having a reflectivity higher than that of the insulating layer 7. In that case, since the conductive layers 12, 13 can be formed simultaneously with the reflective layer 11, and the conductive layers 12, 13 as well as the reflective layer 11 reflect light, the area occupied by the metal reflective area (i.e., the reflective layer 11 and the conductive layers 12, 13) can be secured greater than the area sealed by the sealing member 28, and thereby a lumen maintenance factor, which will be described later, can be further improved.

Two feeding terminals 14, 15 are also patterned on the surface of the insulating layer 7. One of the feeding terminals 14 is connected to the conductive layer 12 on the positive electrode side via a conducting member, not shown, and the other feeding terminal 15 is connected to the conductive layer 13 on the negative electrode side via a conductive member, not shown. Further, the feeding terminals 14, 15 are connected to the circuit substrate 122 of the lighting device 121 via an insulation coating wire, not shown.

That is, an insulation coating wire, not shown, connecting the light-emitting module 1 and the lighting device 121, extends from the feeding terminals 14, 15 of the light-emitting module 1, passes through the wire through hole 106 via the groove portion 106a, and connected to the circuit substrate 122 of the lighting device 121. It is to be noted that the reflective layers 11, the conductive layers 12, 13, and the feeding terminals 14, 15 are simultaneously formed.

The reflective layer 11, the conductive layers 12, 13, and the feeding terminals 14, 15 provided on the surface of the insulating layer 7 are formed in a three-layered structure including a base layer A, an intermediate layer B, and a surface layer C. The base layer A is formed of Cu, and is provided on the insulating layer 7 of the module substrate 5 by plating and etching. The intermediate layer B is formed of Ni and is plated on the top surface of the base layer A. The surface layer C is made of Ag, and is non-electrically plated on the surface of the intermediate layer B. Since the surface layer C is formed of Ag, the reflectance of the reflective layer 11 and the conductive layers 12, 13 is higher than the reflectance of the insulating layer 7, and the entire ray reflectivity is approximately 90.0%.

The light-emitting devices 21 are arranged in a proper alignment on the surface of the reflective layer 11. The light-emitting devices 21 of the present embodiment are bare chips of light-emitting diodes (LEDs). The bear chip is formed by cutting a semiconductor wafer, in which a nitride compound semiconductor (such as nitride gallium compound semiconductor) is formed on a semiconductor substrate, such as sapphire, using a dicing cutter, and forming it in an approximately parallelepiped shape.

Further, the bare chip is a one-sided electrode type chip including two element electrodes 21a on the upper surface thereof, as shown in FIG. 3. The size of each of the element electrodes 21a of the light-emitting device 21 is 0.5 mm long by 0.25 mm wide. The light-emitting device 21 is formed of a LED that emits blue light, in order to cause a light-emitting portion to emit light of white colors, for example.

As shown in FIG. 5, the back surface of the semiconductor substrate of each of the light-emitting devices 21 is adhesively fixed to the surface layer C of the reflective layer 11, using a preferably translucent die bonding material 22, so as to allow the light-emitting device 21 to reflect directly thereunder. The light-emitting devices 21 are arranged in a proper alignment in the longitudinal and lateral directions and mounted on the module substrate 5. First to third light-emitting element strings are formed of the light-emitting devices 21 arranged so as to extend in the longitudinal direction of the reflective layer 11.

In each of the light-emitting element strings, different element electrodes of two light-emitting devices 21 provided adjacent to each other in the direction in which the string extends, i.e., an element electrode 21a of the positive electrode side of one light-emitting element 21 and an element electrode 21a of the negative electrode side of the other light-emitting element 21 are connected via a bonding wire 23 formed of a thin wire made of Au. Thereby, a plurality of (four) light-emitting elements 21 included in each of the light-emitting element strings are connected in series. Accordingly, the light-emitting elements 21 in one string simultaneously emit light in an energized state.

Since an end bonding wire 24, designed to connect the light-emitting elements 21 on both ends of each string is also formed of an Au metal thin wire, heat is not easily conducted. This makes it difficult for the heat of the light-emitting elements 21 of both ends of each string to be transferred (escaped) to the conductive layers 12, 13 through the end bonding wire 24. This achieves uniformity in temperature distribution in each area of the reflective layer 11, and suppresses variation in temperature of the light-emitting elements 21 mounted on the reflective layer 11.

Further, as described above, the light-emitting devices 21 of each string are connected in parallel to the conductive layers 12, 13, via the end bonding wire 24. Accordingly, even if the light-emitting elements 21 of one of the first to third light-emitting element strings cannot emit light due to a bonding failure, for example, the light-emitting module 1 as a whole never fails to emit light.

The frame member 25 is made by forming a synthetic resin into a rectangular frame shape, for example, and is adhesively fixed to the surface of the module substrate 5. The frame member 25 includes a rectangular sealing hole 25a of a size that surrounds all the light-emitting devices 21. The sealing hole 25a surrounds the entire reflective layer 11 and portions of the conductive layers 12, 13. That is, the sealing hole 25a defines the size of a sealed region in which a sealing member, which will be described later, will be filled.

More specifically, the sealing hole 25a has a size that surrounds all the light-emitting elements 21, all the bonding wires 23, and all the end bonding wires 24, as shown in FIG. 3, and the thickness of the frame member 25 and the depth of the sealing hole 25a are set to values at which all the constituent elements 21, 23, 24 can be embedded by the sealing member 28, as shown in FIG. 5. It is to be noted that the size of the sealed region into which the sealing material is filled is equivalent to the opening area (which area will hereinafter be referred to as sealed region) of the sealing hole 25a.

In the present embodiment, the ratio of the area occupied by the reflective layer 11 and the conductive layers 12, 13 in the sealed region is set to be equal to or greater than 80%, for the reasons that will be described below. In other words, in the present embodiment, the area of the portions in which the reflective layer 11 and the conductive layers 12, 13 are not provided and the insulating layer 7 is exposed is suppressed to be less than 20%.

As shown in FIG. 3, the resist layers 26, 26 are provided in positions interposing the reflective layer 11 in the longitudinal direction in the drawing, so as to cover the surface of the module substrate 5. Each of the resist layers 26 has a hole designed to expose the feeding terminals 14, 15, for example, to the outside.

The sealing member 28 is filled into the sealing hole 25a, and embeds the reflective layer 11, the conductive layers 12, 13, the light-emitting elements 21, the bonding wires 23, and the end bonding wires 24. The sealing member 28 is formed of a gas-permeable translucent synthetic resin, such as a transparent silicon resin. A predetermined amount of the sealing member 28 is injected into the sealing hole 25a in an uncured state, and then heated and cured.

An appropriate amount of phosphor body, not shown, is mixed into the sealing member 28. The phosphor body is excited by light emitted by the light-emitting elements 21, and emits light of a color different from the color of the light emitted by the light-emitting elements 21. In the present embodiment, since the light-emitting elements 21 emit blue light, a yellow phosphor body that emits light of yellow colors, which are complementary to blue, is used, so that white light can be emitted. Since thus-mixed phosphor body emits light in the sealing member 28, the entire sealing member 28, which has filled in the sealing hole 25a, functions as a light-emitting portion of the light-emitting module 1.

When the light-emitting module 1 with the above-described configuration is incorporated into the LED lamp 100 and is energized via the lighting device 121, the light-emitting elements 21 covered with the sealing member 28 simultaneously emit blue light, and the yellow phosphor body mixed into the sealing member 28 is excited and emit yellow light. That is, the sealing member 28 functions as a planar light source that emits white light in which blue light and yellow light are mixed.

In this case, the reflective layer 11 functions as a heat spreader that diffuses heat generated by the light-emitting elements 21, and also functions as a reflective mirror that reflects light included in the light radiated from the light-emitting elements 21 and traveling toward the module substrate 5. Further, the conductive layers 12, 13 in the sealed region also function as reflective mirrors as well as heat spreaders, as in the case of the reflective layer 11.

That is, heat from the light-emitting elements 21 is radiated outside the LED lamp 100 via the reflective layer 11, the module substrate 5, the module fixing mount 103, the upper surface of the main body 102, and the heat radiation fin 107. Further, the light reflected by the reflective layer 11 and the light diffused by the sealing member 28 and reflected by the conductive layers 12, 13, as well as the main light directly emitted from the sealing member 28, are provided for use as illumination light via the illumination cover 161.

As described above, according to the present embodiment, since the reflective layer 11 and the conductive layers 12, 13 are provided on the approximately entire surface of the sealed region sealed by the sealing member 28, heat from the light-emitting devices 21 can be effectively radiated and brightness as a planar light source can be sufficiently secured. In other words, the heat radiation effect and the brightness as a light source can be improved by increasing the ratio of the area occupied by the reflective layer 11 and the conductive layers 12, 13 to the sealed region.

Here, the preferable ratio of the area occupied by the reflective layer 11 and the conductive layers 12, 13 to the sealing area sealed by the sealing member 28 will be considered. In the descriptions that follow, the reflective layer 11 and the conductive layers 12, 13 are collectively referred to as reflective layers 11, 12, 13.

The present inventors have performed a lighting test of the LED lamp 100 by varying the ratio of the area occupied by the reflective layers 11, 12, 13 and the area of the other portions in which the surface of the insulating layer 7 is exposed. The lumen maintenance factor and the relative luminous flux in each area were examined. The result thereof is shown in Table 1.

As conditions for the lighting test, blue light-emitting LEDs are used as the light-emitting element 21, the entire ray reflectivity of the insulating layer 7 is set to 35.9%, the entire ray reflectivity of the reflective layers 11, 12, 13 including Ag surface portion C is set to 90.0%, and a transparent silicon resin mixed with a yellow phosphor body is used as the sealing member 28. Further, in Table 1, the area occupied by the reflective layers 11, 12, 13 is a silver-plated area, and the area which is not covered by the reflective layers 11, 12, 13 in the sealed region and in which the insulating layer 7 is exposed is an insulating layer area.

The lumen maintenance factor in Table 1 shows the value of an accelerated evaluation in which the LED lamp 100 is lit for 1000 hours under the state in which the load is higher than the normal usage state with various modifications to the area ratio, and is the value equivalent to the case where the LED lamp 100 is lit for 40000 hours, when converted into the normal usage state. The lumen maintenance factor refers to the ratio of luminous flux after the light-emitting module 1 emits light for 1000 hours to the luminous flux at the time when the light-emitting module 1 emits light for the first time (initial light emission time). The relative luminous flux indicates the ratio of luminous flux of the initial light emission time to the luminous flux of the initial light emission time in an assumed case where the reflective layers 11, 12, 13 are provided in 100% of the sealed region, in cases where the area ratio is variously modified.

TABLE 1

| Silver-plated area (%) | Insulating layer area (%) | Relative luminous flux (%) | Lumen maintenance factor (%) |
|---|---|---|---|
| 60 | 40 | 85.9 | 60.7 |
| 65 | 35 | 87.9 | 64.7 |
| 70 | 30 | 89.8 | 69.5 |
| 80 | 20 | 93.6 | 79.3 |
| 85 | 15 | 95.6 | 87.6 |
| 90 | 10 | 97.5 | 90.5 |
| 95 | 5 | 99.4 | 94.6 |
| 100 | 0 | 100.0 | |

As clear from Table 1, when the area occupied by the reflective layers 11, 12, 13 in the sealed region is set to 80%, the lumen maintenance factor after 1000 hours of lighting was 79.3%. Further, it can be known that, when the ratio of the area occupied by the reflective layers 11, 12, 13 is increased to more than 80%, the lumen maintenance factor also gradually increases. In other words, if the ratio of the area occupied by the reflective layer to the sealed region sealed by the sealing member is equal to or greater than 80%, the value should desirably be high so as to obtain a higher lumen maintenance factor. That is, as a result of the lighting test, it has become clear that, by making the ratio of the area occupied by the reflective layers 11, 12, 13 to the sealed region to be equal to or greater than 80%, approximately 80% of luminous flux can be maintained, with respect to the luminous flux of the initial light emission time, even after approximately 40000 hours of lighting of the LED lamp 100 in a normal usage state.

On the other hand, when the ratio of the area occupied by the reflective layers 11, 12, 13 to the sealed region is less than 80% (that is, when the area in which the insulating layer 7 is exposed exceeds 20%), the lumen maintenance factor after 40000 hours of lighting decreases as the area occupied by the reflective layers 11, 12, 13 decreases. That is, when the area occupied by the reflective layers 11, 12, 13 is less than 80%, 80% of luminous flux cannot be maintained after 40000 hours of lighting.

The lifespan recommended by the manufacturing maker of the light-emitting module 1 (maker rated lifespan) is generally determined whether approximately 80% of luminous flux can be maintained, with respect to the luminous flux of the initial light emission time. Further, the maker rated lifespan is set to be approximately 40000 hours in general. That is, it has become clear that, by making the area occupied by the reflective layers 11, 12, 13 in the sealed region equal to or greater than 80%, the maker rated lifespan (approximately 40000 hours) can be satisfied.

When the ratio of the area occupied by the reflective layers 11, 12, 13 to the sealed region is equal to or greater than 80%, the relative luminous flux was equal to or greater than 90%, as clear from Table 1. The relative luminous flux is a reference indicating the light capturing efficiency (light output). When the relative luminous flux is equal to or greater than 90%, there will be no problem in using the LED lamp 100. That is, since the relative luminous flux becomes 90%, when the area occupied by the reflective layers 11, 12, 13 to the sealed region sealed by the sealing member 28 is equal to or greater than 80%, and light output as the light-emitting module 1 becomes sufficiently high, and the light-emitting module 1 can be provided with a high quality.

The amount of charge of the sealing member 28 to the sealing hole 25a should be adjusted to an appropriate value, such that inconsistency will not be caused in the light emission color as the light-emitting module 1. For example, when the opening area of the sealing hole 25a, i.e., the sealing region is equal to or greater than 100 cm², and the depth of the sealing hole 25a is equal to or greater than 0.5 mm, the amount of charge of the sealing member 28 should preferably be equal to or greater than 80% and equal to or less than 120%, with respect to the volume of the sealing hole 25a.

It is thereby possible to suppress the surface of the sealing member 28 from being formed so as to be dent greatly toward the central portion from the peripheral portion thereof, and to suppress the surface of the sealing member 28 from being formed so as to expand toward the central portion from the peripheral portion thereof. Accordingly, difference in height between the central portion and the peripheral portion of the sealing member 28, or in other words, the thickness of each portion of the sealing member 28 is prevented from being greatly varied.

That is, by adjusting the amount of charge of the sealing member 28 to an appropriate value, it is possible to suppress the central portion from emitting light of a color closer to the color (blue) emitted by the light-emitting element 21 in a case when the central portion of the sealing member 28 is thinner than the peripheral portion and has lower amount of phosphor body than the peripheral portion, and to suppress the central portion from emitting light of a color closer to the color (yellow) of the phosphor body. Thereby, it is possible to prevent inconsistency in the color emitted by the sealing member 28 that functions as a planar light source.

As described above, according to the present embodiment, a plurality of light-emitting elements 21 are mounted on one reflective layer 11, and the ratio of the area occupied by the reflective layers 11, 12, 13 to the sealed region of the sealing member 28 is set to be equal to or greater than 80%. Accordingly, compared to the structure in which one light-emitting element is mounted on the same number of reflective layer, the ratio of the area of the insulating layer 7 exposed to the sealing member 28 without being covered by the reflective layers 11, 12, 13 in the sealed region can be decreased to be less than 20%, and light can be efficiently reflected in the direction in which the light is used by the reflective layers 11, 12, 13 including the Ag surface portion C.

Further, according to the present embodiment, since the area of the insulating layer 7 exposed to the sealing member 28 is small, the area of the portion on which light is made incident in the insulating layer 7 can be made small. Thereby, the amount of the insulating layer 7 being decomposed by light and gasified becomes small, and organic components emitted into the gas-permeable sealing member 28 becomes small. It is thereby possible to suppress the problem that gasified and emitted organic materials react with the Ag surface portion C of the reflective layers 11, 12, 13 and tarnish to a darkish color, and to suppress reduction in reflective efficiency of the light-emitting module 1.

That is, according to the present embodiment, the reflective efficiency of the reflective layer itself can be improved by increasing the area occupied by the reflective layers 11, 12, 13, and it is also possible to maintain the improved initial luminous output for a long period of time by preventing the reflective layers 11, 12, 13 from tarnishing.

Further, according to the present embodiment, since 80% of the sealing area is occupied by the reflective layers 11, 12, 13, the amount of light that is reflected in the portion of the sealed region 28 in which the insulating layer 7 is exposed does not affect the luminous output of the entire light-emitting module 1. Since the color of the insulating layer 7 may be a dark color, for example, freedom in selection of the insulating layer 7 is increased, and thereby the insulating layer 7 can be manufactured at a low cost.

Figure 6:
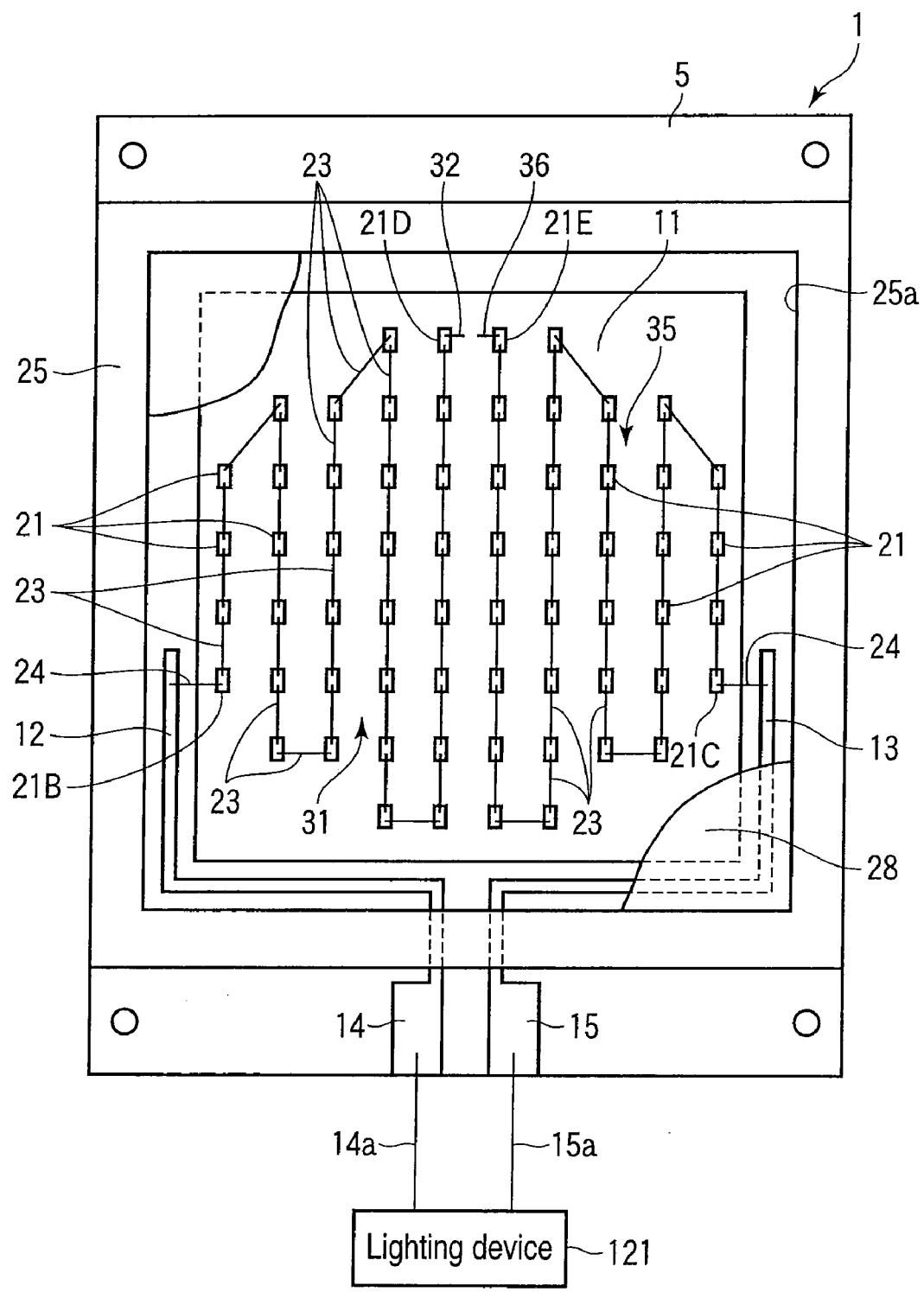
FIG. 6 is a plan view illustrating a light-emitting module according to the second embodiment of the present invention.

Hereinafter, a light-emitting module 1 of the second embodiment of the present invention will be described with reference to FIG. 6. The matters other than those that will be described below are the same as the first embodiment, including the structures not shown in FIG. 6. Accordingly, the structural elements same as those of the first embodiment will be denoted by the same reference numerals as those of the first embodiment and detailed description of such elements will be omitted.

In the present embodiment, too, a rectangular sealing hole 25a of a frame member 25 defines the sealed region to be sealed by the sealing member 28. That is, the sealing member 28 seals the reflective layer 11, portions of the conductive layers 12, 13, the light-emitting elements 21, the bonding wire 23, and the end bonding wire 24 in the sealed region.

It is to be noted that the ratio of the area occupied by the reflective layer 11 and the conductive layers 12, 13 to the sealed region is designed to be equal to or greater than 80%.

The light-emitting element 21 provided on the surface of the reflective layer 11 are divided into a first light-emitting element string 31 and a second light-emitting element string 35. The first light-emitting element string 31 is formed by serially connecting half the total number of the light-emitting elements 21, which are mounted on the module substrate 5, via the bonding wire 23. Similarly, the second light-emitting element string 35 is formed by serially connecting the light-emitting elements 21 of the remaining half the total number of the light-emitting elements 21 mounted on the module substrate 5 via the bonding wire 23.

Each of the first and second light-emitting element strings 31, 35 does not extend in a linear shape, and is provided in a serpentine shape such that it is turned in a plurality of places. Thus, the light-emitting elements 21 included in each of the light-emitting element strings 31, 35 does not necessarily need to be arranged straightly, and only needs to be electrically connected in series.

A light-emitting device (shown by the reference numeral 21B in FIG. 6 for easy recognition) arranged at one end of the first light-emitting element string 31 is connected to the conductive layer 12 on the positive electrode side via the end bonding wire 24. Similarly, the light-emitting element (shown by the reference numeral 21C in FIG. 6 for easy recognition) arranged at one end of the second light-emitting element string 35 is connected to the conductive layer 13 of the negative electrode side via the end bonding wire 24.

Further, the light-emitting element (shown by reference numeral 21D in FIG. 6 for easy recognition) arranged at the other end of the first light-emitting element string 31 is connected to the reflective layer 11 via an intermediate bonding wire 32. That is, one end of the intermediate bonding wire 32 is connected to the element electrode on the positive electrode side of the light-emitting element 21D, and the other end is connected to the reflective layer 11 in the vicinity of the light-emitting element 21D.

Similarly, a light-emitting element (shown by reference numeral 21E in FIG. 6 for easy recognition) arranged on the other end of the second light-emitting element string 5 is connected to the reflective layer 11 via an intermediate bonding wire 36. That is, one end of the intermediate bonding wire 36 is connected to the element electrode on the negative electrode side of the light-emitting element 21E, and the other end is connected to the reflective layer 11 in the vicinity of the light-emitting element 21E.

Accordingly, the first light-emitting element string 31 and the second light-emitting element string 35 are serially connected via the intermediate bonding wires 32, 36, which supply a potential to the reflective layer 11. That is, while the light-emitting module 1 of the present embodiment is emitting light, a potential is being supplied to the reflective layer 11, and it is possible to prevent the reflective layer 11 from being the cause of noise generation.

That is, when a potential is not supplied to the metal reflective layer 11, the reflective layer 11 is affected by external high-frequency noise, and in some cases, the reflective layer 11 may become a noise radiation source due to the antenna effect of the reflective layer 11. Although this may result in superimposition of noise on the current to be applied to the light-emitting elements 21, such a problem can be prevented by fixing the potential of the reflective layer 11, as described above.

Further, in the second embodiment, the conductive layer 12 and the feeding terminal 14 on the positive electrode side are integrally formed, and the conductive layer 13 on the negative electrode side is integrally formed with the feeding terminal 15. Further, the lighting device 121 is connected to the two feeding terminals 14, 15 via the insulating coating wires 14a, 15a.

The light-emitting module 1 of the present embodiment obtains the same effect as can be obtained from the light-emitting module 1 of the first embodiment. In addition to that, the light-emitting module 1 of the present embodiment has advantages as will be described below.

That is, when all the light-emitting elements 21 are connected in series as in the present embodiment, the potential difference (potential difference between the electrodes) between the conductive layer 12 on the positive electrode side and the conductive layer 13 on the negative electrode side becomes a value obtained by multiplying the chip voltage that causes one light-emitting element 21 to emit light by the total number of light-emitting elements 21 to be used. Further, in the light-emitting module 1 of the present embodiment, each of the first and second light-emitting element strings 31, 35 includes 32 light-emitting elements 21. Accordingly, when the chip voltage to be applied to one light-emitting element 21 is approximately 3.2 V, a voltage of approximately 100 V is applied to the first light-emitting element string 31, and a voltage of approximately 100 V is applied to the second light-emitting element string 35. In this case, exactly the intermediate potential of the potential difference between the electrodes is supplied to the reflective layer 11.

That is, although the potential difference between the electrodes applied by the lighting device 121 to the light-emitting module 1 is 200 V in the above-described case, this potential difference does not become the maximum difference potential of the light-emitting element string. As described above, approximately 50% of voltage of the difference potential between the electrodes is applied to the reflective layer 11, and the maximum difference potential in the first light-emitting element string 31 and the maximum difference potential in the second light-emitting element string 35 can be reduced to ½ of the difference potential between the electrodes.

As described above, according to the present embodiment, the maximum potential difference between the first light-emitting element string 31 and the second light-emitting element string 35 can be made smaller than the potential difference between the electrodes determined according to the number of the light-emitting elements 21 connected in series, and thereby the voltage applied to the element electrode of each of the light-emitting elements 21 and the reflective layer 11 including an Ag surface portion. It is thereby possible to suppress migration caused by generation of Ag ions, and to suppress an insulation breakdown between the element electrode of the light-emitting element 21 and the reflective layer 11.

In the present embodiment, the number of the light-emitting elements 21 included in the first and second light-emitting element strings 31, 35 has been described as approximately the same, but the number of the light-emitting elements 21 included in the first and second light-emitting element strings 31, 35 may vary. Further, in the present embodiment, only a pair of light-emitting element strings 31, 35 electrically connected in series has been provided via the intermediate bonding wires 32, 36 and the reflective layer 11, but a plurality of sets of light-emitting element string groups may be provided on one reflective layer 11. In that case, the conductive layer 14 on the positive electrode side and the conductive layer 15 on the negative electrode side may be connected such that the groups of the light-emitting element strings are in an electrically parallel relation. Further, in the present embodiment, the description has been given based on the case where the two light-emitting element strings 31, 35 are connected in series via the reflective layer 11, but three or more light-emitting element strings may be connected in series.

Figure 7:
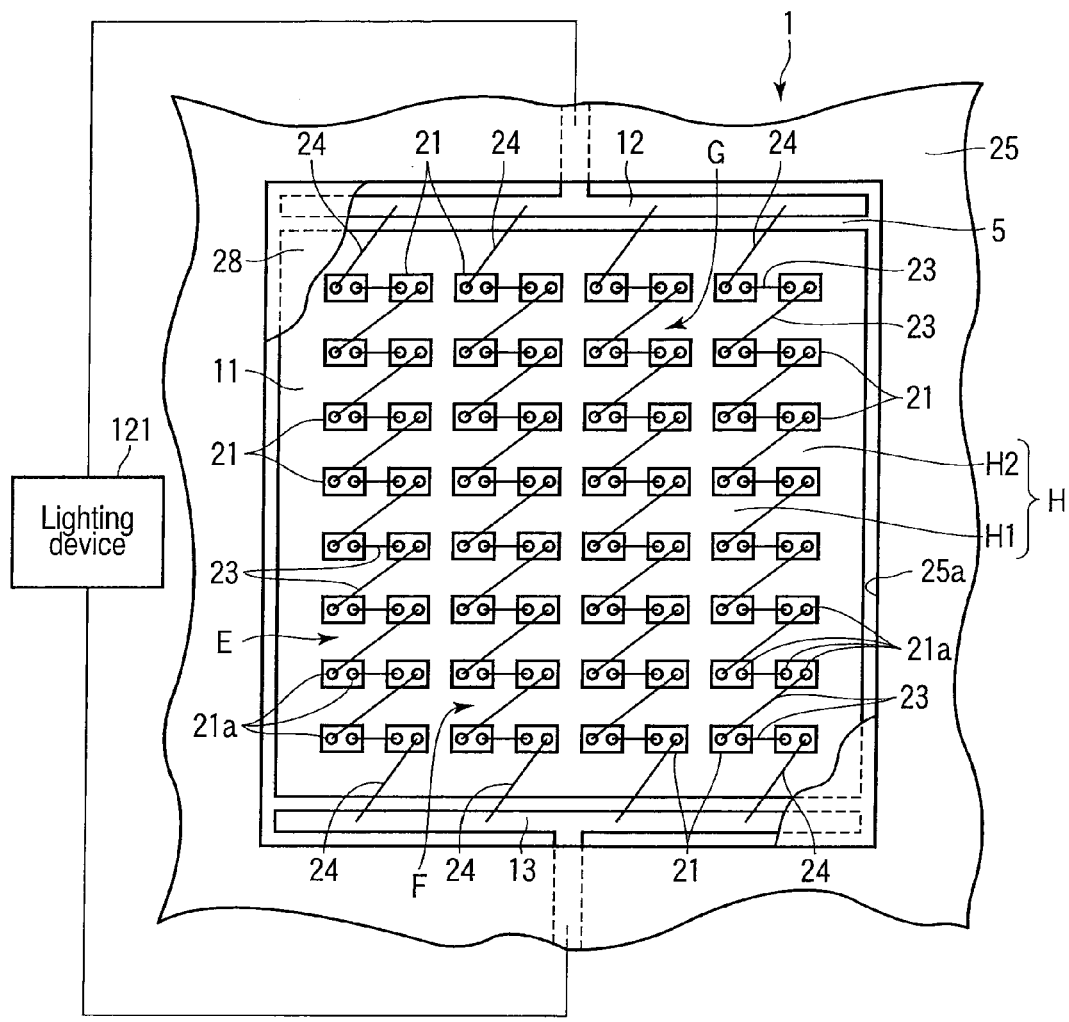
FIG. 7 is a plan view illustrating main portions of a light-emitting module according to the third embodiment of the present invention.

Next, the light-emitting module 1 according to the third embodiment of the present invention will be described with reference to FIG. 7. The matters other than those that will be described below are the same as those of the first embodiment, including the structures that are not shown in FIG. 7. Accordingly, the structural elements same as those of the first embodiment will be denoted by the same reference numerals as those in the first embodiment, and detailed description of such elements will be omitted.

The light-emitting module 1 of the present embodiment includes a plurality of light-emitting element strings E-H. The present embodiment has a configuration suitable in a case where the light-emitting element strings E-H includes a large number of light-emitting elements 21. Since each of the light-emitting element strings has the same structure, the light-emitting element string H at the right end in the drawing will be described below as a representative.

The light-emitting element string H includes a first string element H1 including 8 light-emitting elements 21 mounted on the reflective layer 11 at predetermined intervals in the longitudinal direction in the drawing, a second string element H2 including 8 light-emitting elements 21 mounted on the reflective layer 11 at predetermined intervals, and a plurality of bonding wires 23 electrically and alternately connecting the light-emitting elements 21 of the first and second string elements H1, H2 in series. The first string element H1 and the second string element H2 are in a relation parallel to each other.

A short bonding wire 23 connects an element electrode 21a on the positive electrode side of the light-emitting element 21 of the first string element H1 and the element electrode 21a on the negative electrode side of the light-emitting element 21 of the second string element H2, arranged left and right in the drawing. Further, the bonding wire 23, which extends obliquely, connects the element electrode 21a on the negative electrode of the light-emitting element 21 of the second string element H2, and the element electrode 21a on the positive electrode side of the light-emitting element 21 of the first string element H1, positioned in an obliquely downward position.

Further, the element electrode 21a of the light-emitting element 21 at the upper end in the drawing of the first element H1 is connected to the conductive layer 12 on the positive electrode side via the end bonding wire 24, and the element electrode 21a on the positive electrode side of the light-emitting element 21 at the lower end in the drawing of the second element H2 is connected to the conductive layer 12 on the negative electrode side via the end bonding wire 24.

Further, the light-emitting module 1 of the present embodiment obtains the same effect as can be obtained from the light-emitting module of the first embodiment. In addition to that, according to the present embodiment, the ratio of the area occupied by the reflective layer 11, and the conductive layers 12, 13 to the sealed region by the sealing member 28 becomes equal to or greater than 80%, such as approximately 94%.

Further, in the present embodiment, as in the above-described second embodiment, 64 light-emitting elements 21 can be arranged in a proper alignment and mounted on the reflective layer 11, and the configuration is suitable for including many light-emitting elements 21. Further, according to the present embodiment, it is possible to increase luminous flux emitted by the light-emitting module 1, while suppressing the reflective layer 11 from increasing in the longitudinal direction in the drawing.

Figure 8:
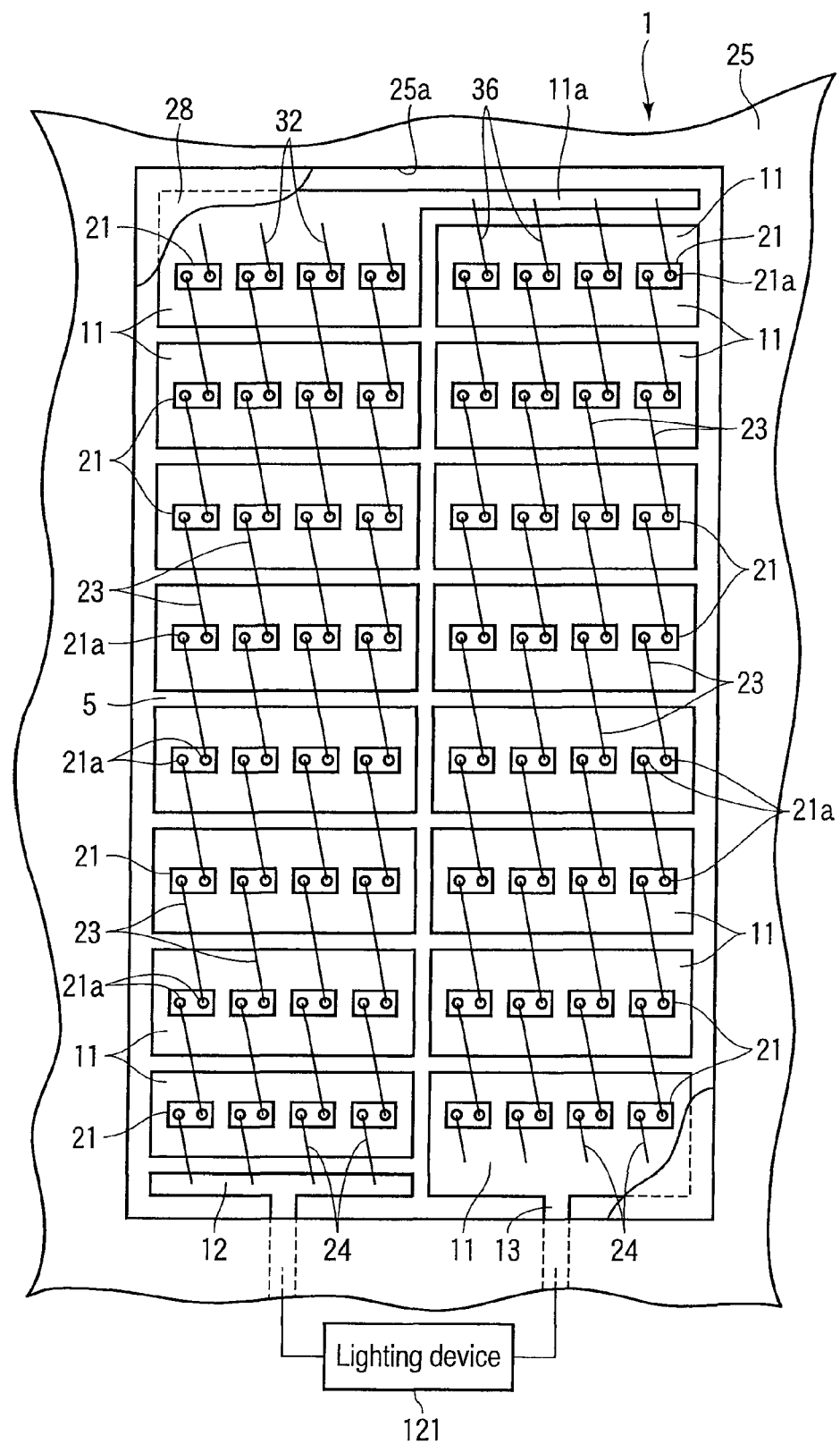
FIG. 8 is a plan view illustrating main portions of a light-emitting module according to the fourth embodiment of the present invention.

Next, the light-emitting module 1 according to the fourth embodiment of the present invention will be described with reference to FIG. 8. The matters other than those that will be described below are the same as those of the first embodiment, including the structures that are not shown in FIG. 8. Accordingly, the structures same as those of the first embodiment will be denoted by the same reference numerals as those in the first embodiment, and detailed description of such structures will be omitted.

The light-emitting module 1 of the present embodiment has a configuration in which a plurality of reflective layers 11 are arranged on a module substrate 5. More specifically, two strings of 8 reflective layers 11, arranged at predetermined intervals in the longitudinal direction in the drawing, are arranged side by side in the lateral direction in the drawing on the module substrate 5. The two strings of the reflective layers include 16 reflective layers 11 in total, and a portion (gap) exists between the reflective layers 11, in which the insulating layer 7 of the module substrate 5 is exposed.

Four light-emitting elements 21 are mounted on each of the reflective layers 11, arranged at equal intervals in the lateral direction in the drawing. Further, the light-emitting elements 21 mounted on the reflective layer 11 and adjacent to each other in the longitudinal direction in the drawing are electrically connected via four bonding wires 23 extending obliquely. More specifically, the element electrodes 21a of different electrodes of the two light-emitting elements 21 arranged in the longitudinal direction are sequentially connected via the bonding wire 23, and 8 light-emitting elements 21 are serially connected in the vertical direction in the drawing.

The conductive layer 12 on the positive electrode side is adjacent to the lower side of the reflective layer 11 at the lowest end of the reflective layers of the string at the left in the drawing. Further, the conductive layer 13 on the negative electrode side is integrally formed with the reflective layer 11 at the lowest end of the reflective layers of the string at the right side in the drawing. Further, the conductive layer 13 on the negative electrode side is integrally formed with the reflective layer 11 at the lowest end of the string of reflective layers at the right side in the drawing. Further, the reflective layer 11 at the most upper end of the string of reflective layers of the string at the left in the drawing includes an extension portion 11a, which extends upward in the drawing of the reflective layer 11 at the most upper end of the string of reflective layers at the right side in the drawing.

The four light-emitting elements 21 mounted on the reflective layer 11 at the lowest end of the string of reflective layers at the left side in the drawing are connected to the conductive layer 12 on the positive electrode side via the end bonding wire 24. Further, the reflective layer 11 at the most upper end of the string of reflective layers at the left side in the drawing and the four light-emitting elements 21 mounted thereon are connected via the intermediate bonding wire 32. Further, four light-emitting elements 21 mounted on the reflective layer 11 at the most upper end of the string of reflective layers at the right side in the drawing are connected via an intermediate bonding wire 36. Moreover, the reflective layer 11 at the lowest end of the reflective layers at the right side in the drawing and the four light-emitting elements 21 mounted thereon are connected via an end bonding wire 24 on the negative electrode side.

That is, the light-emitting module 1 of the present embodiment comprises 4 strings of serial circuits, each formed of 16 light-emitting elements 21 connected in series, and the four strings of serial circuits are electrically connected in parallel. In the light-emitting module 1 of the present embodiment, the ratio of the area occupied by the reflective layer 11 and the conductive layers 12, 13 to the sealed region sealed by the sealing member 28 is equal to or greater than 80%, such as 85%.

As described above, in the present embodiment, too, since the ratio of the area occupied by the reflective layers 11, 12, 13 to the sealed region is set to be equal to or greater than 80%, the same effect as can be obtained from the above-described first embodiment can be obtained, and thereby luminous output can be increased and can be maintained for a long period of time.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the above-described embodiment, the case has been described where the thin insulating layer 7 is stacked on the surface of the metal base plate 6, but the present embodiment is not limited thereto, and a module substrate formed of a single-layer insulating plate, a module substrate formed of a plurality of insulating plates stacked thereon, or a metal base-shaped module substrate formed by stacking an insulating material layer on a metal base plate, such as iron or aluminum, may be used. When the module substrate is formed of a single-layered insulating plate, the surface portion of the module substrate forms an insulating layer.

Organic materials that can be used in forming the insulating layer 7 of the module substrate 5 include a synthetic resin, such as an epoxy resin (including one mixed with a filler), and the reflectance thereof may be equal to or greater than 50%. Further, when the insulating layer 7 of the module substrate 5 is formed of an insulating plate, for example, the thickness of the insulating layer 7 should preferably be equal to or lower than 100 μm, so as to decrease the absolute amount of gas decomposed and released therefrom.

Further, in the above-described embodiment, the case has been described where a one-sided electrode type light-emitting diode (LED) formed of a bare chip has been described as being used as the light-emitting element 21, but the light-emitting element 21 is not limited thereto, and one-sided electrode type semiconductor light-emitting element, such as an electro-luminescence (EL) element, for example, may be used. A light-emitting element of this kind includes an element electrode on the positive and negative electrode sides on one surface thereof. When a LED is used as a light-emitting element, the LED should preferably emit blue light.

Further, in the above-described embodiment, an Au thin wire, for example, has been described as being used as the bonding wires 23, 24, 32, 36, so as to secure connection between the element electrode 21a and the conductive layers 12, 13, but the bonding wires 23, 24, 32, 36 are not limited thereto, and other metal thin wires may be used.

Moreover, a phosphor body that emits light of a color complementary to the color of light emitted by the light-emitting element 21 has been described as being used by being mixed into transparent silicon resin, so as to obtain white illumination light, but the phosphor body does not necessarily need to be mixed. Further, the color of the phosphor body may be any color, and any color appropriate as the color to be emitted by the LED lamp 100 should be selected.

What is claimed is:

1. A light-emitting module, comprising:
   a module substrate including an insulating layer at least on a surface;
   a reflective layer provided on the insulating layer and having a reflectance higher than a reflectance of the insulating layer;
   a conductive layer provided on the insulating layer in the vicinity of the reflective layer and having a reflectance greater than the insulating layer;
   a light-emitting element provided on the reflective layer;
   a translucent sealing member provided on the module substrate so as to fill in the reflective layer, the conductive layer, and the light-emitting element, wherein
   a ratio of an area occupied by the reflective layer and the conductive layer to the sealed region sealed by the sealing member is equal to or greater than 80%.

2. The light-emitting module according to claim 1, wherein the thickness of the insulating layer ranges from 50 to 200 mm.

3. The light-emitting module according to claim 1, wherein the module substrate includes a metal base plate on which the insulating layer is stacked.

4. The light-emitting module according to claim 1, wherein a plurality of light-emitting elements are arranged on the reflective layer, and the light-emitting module comprises:
   a bonding wire connecting the light-emitting elements in series; and
   an end bonding wire connecting a light-emitting element included in the light-emitting elements connected in series and provided at an end to the conductive layer.

5. The light-emitting module according to claim 4, further comprising:
   an intermediate bonding wire connecting a light-emitting element included in the light-emitting elements connected in series and provided in-between to the reflective layer.

6. An illumination device, comprising:
   a light-emitting module according to claim 1; and
   a lighting device configured to light the light-emitting module.

7. An illumination device, comprising:
   a light-emitting module according to claim 2; and
   a lighting device configured to light the light-emitting module.

8. An illumination device, comprising:
   a light-emitting module according to claim 3; and
   a lighting device configured to light the light-emitting module.

9. An illumination device, comprising:
   a light-emitting module according to claim 4; and
   a lighting device configured to light the light-emitting module.

10. An illumination device, comprising:
    a light-emitting module according to claim 5; and
    a lighting device configured to light the light-emitting module.

* * * * *